United States Patent
Cameron

(10) Patent No.: US 9,557,646 B2
(45) Date of Patent: *Jan. 31, 2017

(54) PHENOLIC POLYMERS AND PHOTORESISTS COMPRISING SAME

(71) Applicant: Rohm and Haas Electronic Materials, LLC, Marlborough, MA (US)

(72) Inventor: James F. Cameron, Cambridge, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,816

(22) Filed: Jan. 12, 2015

(65) Prior Publication Data
US 2015/0355542 A1    Dec. 10, 2015

Related U.S. Application Data

(62) Division of application No. 12/075,726, filed on Mar. 12, 2008, now Pat. No. 8,932,793.

(60) Provisional application No. 60/906,352, filed on Mar. 12, 2007.

(51) Int. Cl.
| | | |
|---|---|---|
| G03F 7/004 | (2006.01) | |
| G03F 7/039 | (2006.01) | |
| G03F 7/16 | (2006.01) | |
| G03F 7/20 | (2006.01) | |
| G03F 7/32 | (2006.01) | |
| G03F 7/40 | (2006.01) | |
| C08F 220/10 | (2006.01) | |
| C08F 220/14 | (2006.01) | |
| C08F 220/18 | (2006.01) | |
| C08F 222/12 | (2006.01) | |
| G03F 7/00 | (2006.01) | |
| H01L 21/266 | (2006.01) | |
| C08F 220/30 | (2006.01) | |
| C08K 5/03 | (2006.01) | |
| C08K 5/42 | (2006.01) | |
| H01L 23/00 | (2006.01) | |

(52) U.S. Cl.
CPC ........... G03F 7/0392 (2013.01); C08F 220/10 (2013.01); C08F 220/14 (2013.01); C08F 220/18 (2013.01); C08F 220/30 (2013.01); C08F 222/12 (2013.01); G03F 7/0007 (2013.01); G03F 7/0397 (2013.01); G03F 7/16 (2013.01); G03F 7/20 (2013.01); G03F 7/32 (2013.01); G03F 7/40 (2013.01); H01L 21/266 (2013.01); C08F 2220/301 (2013.01); C08K 5/03 (2013.01); C08K 5/42 (2013.01); H01L 24/11 (2013.01); H01L 2224/1147 (2013.01); H01L 2224/11472 (2013.01); H01L 2924/01025 (2013.01); H01L 2924/01078 (2013.01); H01L 2924/01079 (2013.01); H01L 2924/09701 (2013.01); H01L 2924/12042 (2013.01); H01L 2924/14 (2013.01)

(58) Field of Classification Search
CPC ...... G03F 7/007; G03F 7/0397; C08F 220/14; C08F 220/18; C08F 220/12; C08F 220/30; C08K 5/03; C08K 5/42; H01L 21/266
USPC .................. 430/270.1, 311, 322, 331, 281.1
See application file for complete search history.

(56) References Cited

U.S. PATENT DOCUMENTS

| | | | |
|---|---|---|---|
| 4,855,369 A * | 8/1989 | Yezrielev | C08F 212/04 526/213 |
| 5,576,137 A | 11/1996 | Frass et al. | |
| 6,010,824 A | 1/2000 | Komano et al. | |
| 6,051,361 A | 4/2000 | Hattori et al. | |
| 6,114,085 A * | 9/2000 | Padmanaban | G03F 7/091 430/270.1 |
| 6,132,929 A | 10/2000 | Nakamura et al. | |
| 6,238,838 B1 | 5/2001 | Gaschler et al. | |
| 6,300,035 B1 | 10/2001 | Thackeray et al. | |
| 6,451,498 B1 | 9/2002 | Pirri et al. | |
| 6,503,693 B1 | 1/2003 | Mohondro et al. | |
| 6,709,807 B2 | 3/2004 | Hallock et al. | |
| 6,753,125 B2 | 6/2004 | Choi et al. | |
| 6,797,451 B2 | 9/2004 | Hong et al. | |
| 6,866,986 B2 * | 3/2005 | Chun | G03F 7/405 257/E21.026 |
| 2002/0026022 A1 | 2/2002 | Sang-jun | |
| 2004/0185378 A1 | 9/2004 | Kodama et al. | |
| 2005/0082611 A1 | 4/2005 | Peake et al. | |
| 2007/0099107 A1 | 5/2007 | Shimbori | |
| 2007/0190465 A1 | 8/2007 | Nishikawa et al. | |
| 2008/0227942 A1 | 9/2008 | Benderly | |

FOREIGN PATENT DOCUMENTS

| | | | | |
|---|---|---|---|---|
| EP | 1729176 A1 | 12/2006 | | |
| EP | 1729176 A2 * | 12/2006 | ............ | G03F 7/027 |
| JP | 2005-031193 A * | 2/2005 | ............ | G03F 7/039 |
| JP | 2005031193 A | 2/2005 | | |

(Continued)

OTHER PUBLICATIONS

Machine translation of JP 2005-031193 (no date).*

(Continued)

Primary Examiner — Amanda C Walke

(74) Attorney, Agent, or Firm — Mintz Levin Cohn Ferris Glovsky and Popeo, P.C.; Peter F. Corless

(57) ABSTRACT

The present invention relates to new polymers that contain phenolic groups spaced from a polymer backbone and photoacid-labile group. Preferred polymers of the invention are useful as a component of chemically-amplified positive-acting resists.

8 Claims, No Drawings

(56) References Cited

FOREIGN PATENT DOCUMENTS

| JP | 2006328241 A | | 12/2006 | | |
| KR | 2005-0190508 A | * | 11/2005 | ............. | G03F 7/039 |
| KR | 20050109508 A | | 11/2005 | | |
| WO | 2004081065 A1 | | 9/2004 | | |
| WO | WO 2004/081065 A1 | * | 9/2004 | ............. | G03F 7/039 |
| WO | 2005091074 A1 | | 9/2005 | | |

OTHER PUBLICATIONS

Machine Translation of JP 2005-031193.
European Search Report of corresponding European Application Serial No. EP 08 25 0839.
English Language Summary of Office Action of counterpart Chinese Appiication No. 201310531053.1 (5 Pages).
English Language Summary of Office Action of counterpart Korean Application No. 10-2015-0025160 (3 Pages).

\* cited by examiner

PHENOLIC POLYMERS AND PHOTORESISTS COMPRISING SAME

The present application is a divisional application of U.S. application Ser. No. 12/075,726, filed Mar. 12, 2008, which claims the benefit of U.S. provisional patent application No. 60/906,352, filed Mar. 12, 2007, which applications are incorporated therein by reference in their entirety.

The present invention relates to new phenolic copolymers that comprise a photoacid-labile groups and a distinct phenolic that is spaced from the copolymer such as through a polymerized acrylate moiety. Polymers of the invention are particularly useful as a component of chemically-amplified positive-acting resists.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

Chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone.

While currently available photoresists are suitable for many applications, current resists also can exhibit significant shortcomings, particularly in high performance applications such as formation of highly resolved sub-half micron and sub-quarter micron features.

Consequently, photoresists are of interest that can be photoimaged with short wavelength radiation, including exposure radiation of 270 nm or less, such as wavelengths of 248 nm (provided by KrF laser). See JP1996044063 which reports a certain resist exposed with a KrF stepper. Use of such short exposure wavelengths can enable formation of smaller features. Accordingly, a photoresist that yields well-resolved images upon 248 nm exposure could enable formation of extremely small (e.g. sub-0.25 μm) features that respond to constant industry demands for smaller dimension circuit patterns, e.g. to provide greater circuit density and enhanced device performance.

It thus would be desirable to have new photoresist compositions, particularly resist compositions that can be imaged at short wavelengths such as 248 nm.

We have now found new phenolic polymers that contain photoacid-labile units and phenolic groups that are spaced by at least carbon or other atom from the polymer backbone.

Particularly preferred polymers of the invention comprise polymerized acrylate groups that comprise a phenolic moiety spaced from the polymer backbone.

In one aspect, polymers and photoresists comprising such polymers are provided where the polymer comprises repeat units that comprise a structure of the following Formula I:

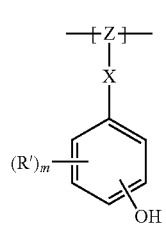

wherein in Formula I, Z is a bridge unit; X is one or more atoms; each $R^1$ is the same or different non-hydrogen substituent; and m is an integer of from zero (where no $R^1$ substituents are present) to 4.

In certain preferred aspects of the invention, polymers and photoresists comprising such polymers are provided where the polymer comprises repeat units that comprise a structure of the following formula II:

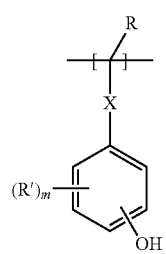

where R is hydrogen or alkyl such as $C_{1-6}$alkyl particularly methyl; and X, $R^1$ and in are the same as defined for Formula I above.

Preferred polymers and photoresists comprising such polymers may comprise additional repeat units distinct from spaced phenolic units such as those of Formulae I and II above, i.e. preferred polymers of the invention include copolymers, terpolymers, tetrapolymers, pentapolymers and other higher order polymers, with terpolymers and tetrapolymers being particularly suitable for many photoresist applications.

Generally preferred higher order polymers may comprise repeat units that may facilitate lithographic processing of a photoresist comprising the polymer. Thus, preferred additional polymer repeat units photoacid-labile groups such as those that can generate an alkaline, aqueous-soluble group such as carboxy in the presence of photogenerated acid; groups that may be substantially inert to lithographic processing such as phenyl optionally substituted with ring substituents that do not undergo cleavage reactions under typical lithographic conditions such as halogen, optionally substituted alkyl including $C_{1-6}$alkyl, and optionally substituted alkoxy including $C_{1-6}$alkoxy; cyano-containing groups.

More particularly, preferred higher order polymers of the invention may contain photoacid-labile groups in addition to spaced phenolic groups with additional distinct repeat units optionally present. For instance, preferred polymers of the invention include those that comprise a structure of the following Formula III:

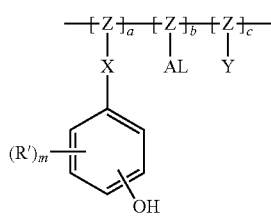

wherein each Z is the same or different bridge unit; X, $R^1$ and m are the same as defined in Formula I above;

AL is a moiety that comprises a photoacid-labile group such as a photoacid-labile ester or acetal group;

Y is a moiety that is distinct from the spaced phenolic group or moiety that comprises AL, e.g. suitable Y groups may comprise moieties that are substantially unreactive to lithographic processing e.g. such as phenyl optionally substituted with moieties that are substantially inert to lithographic processing such as halogen, cyano, alkyl, alkoxy; ester groups that do not undergo photoacid-induced cleavage reactions; alicyclic groups having such as groups having 5-20 ring carbon atoms e.g. cylohexyl, adamantly, norbornyl; and lactones such as butyrolacontes;

a, b and c are mole percents of the respective polymer units based on total repeat units in the polymer and a and b are each greater than zero and c may be zero (where no Y groups are present in the polymer) or greater than zero. Preferred values of a are from 5 to about 95 or more percent, more typically from about 10 to about 40, 50, 60, 70, 80 or 90 percent; preferred values of b are from about 1 to about 70 percent, more preferably from about 2, 3, 4, or 5 to about 10, 15, 20, 25, 30, 40 or 50 percent; preferred values of c are from zero, 1, 2, 5, 10 or 15 to about 20, 25, 30, 40, 50 or 60 percent, more typically about 5 or 10 to about 15, 20, 25 or 30 percent.

In one aspect, preferred polymers of the invention comprise photoacid-labile ester groups in addition to spaced phenolic groups. For instance, such preferred polymers comprise a structure of the following Formula IV:

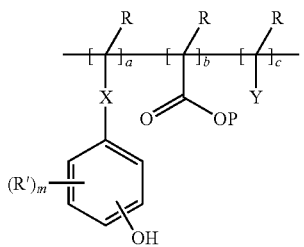

wherein X, $R^1$, m, Y, a, b and c are each the same as defined in Formula III above;

each R is the same or different and is hydrogen or optionally substituted alkyl such as optionally substituted $C_{1-6}$ alkyl particularly methyl; and P is a moiety that provides a photoacid-labile ester, particularly where P provides a fully-substituted alkyl atom linked to the ester oxygen such as tert-butyl and methyladamantyl.

Preferred polymers of the invention can be highly useful as a resin component of a photoresist composition. Resists of the invention typically contain a photoactive component such as one or more photoacid generator compounds in addition to the resin component. Photoresists of the invention also may contain a blend of resins, where at least one resin blend member is a polymer of the invention. Preferred photoresists are chemically-amplified resists where a polymer of the invention and/or another component of the resists such as an additional resin which comprises one or more photoacid-labile groups.

The invention also provides methods for forming relief images, including methods for forming a highly resolved relief image such as a pattern of lines where each line has essentially vertical sidewalls and a line width of 0.40 microns or less, and even a width of 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention. The invention also includes methods for manufacturing such articles, particularly semiconductor chips, using a photoresist and/or polymer of the invention.

Additionally, in a preferred aspect, the invention provides improved ion implantation processing. Such a process may include implanting dopant ions (e.g. Group III and/or V ions such as boron, arsenic, phosphorus and the like) into a surface of a substrate (e.g. semiconductor wafer) having thereon a photoresist of the invention which serves as a mask. The resist-masked substrate may be placed in a reaction chamber which can provide reduced pressure and a plasma of ions from an ionizable source. Those ions include dopants which are electrically active when implanted into the substrate. Voltages may be applied in the reaction chamber (such as through electrically conductive chamber walls) to selectively implant the dopant ions.

Other aspects of the invention are disclosed infra.

As stated above, polymers are provided that comprise phenolic groups spaced by one or more atoms from the polymer backbone. Typical spacer groups may comprise alkyl and/or hetero atoms such as oxygen or optionally substituted sulfur (e.g. S(O), $S(O)_2$) that comprise a chain of 1 or more atoms, generally 1 to about 2, 3, 4, 5, 6, 7, 8, 9, or 10 atoms, interposed between the polymer backbone and a phenolic group. Polymers of the invention are particularly useful as a photoresist resin component.

Polymers of the invention also may contain units in addition to spaced phenolic groups. As discussed above, preferred polymers comprise repeat units that contain one or more photoacid-labile groups.

Suitable photoacid-labile groups include ester and acetal groups. Preferred are t-butyl esters as well as carbon alicyclic photoacid labile ester groups. Preferred alicyclic groups of such esters will have a molecular volume of at least about 125 or about 130 $Å^3$, more preferably a molecular volume of at least about 140 or 160 $Å^3$. Alicyclic groups larger than about 220 or 250 $Å^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Particularly preferred quaternary alicyclic groups of photoacid-labile units include the following, where the wavy line depicts a bond to the carboxyl oxygen of the ester group, and R is suitably optionally substituted alkyl, particularly $C_{1-8}$ alkyl such as methyl, ethyl, etc.

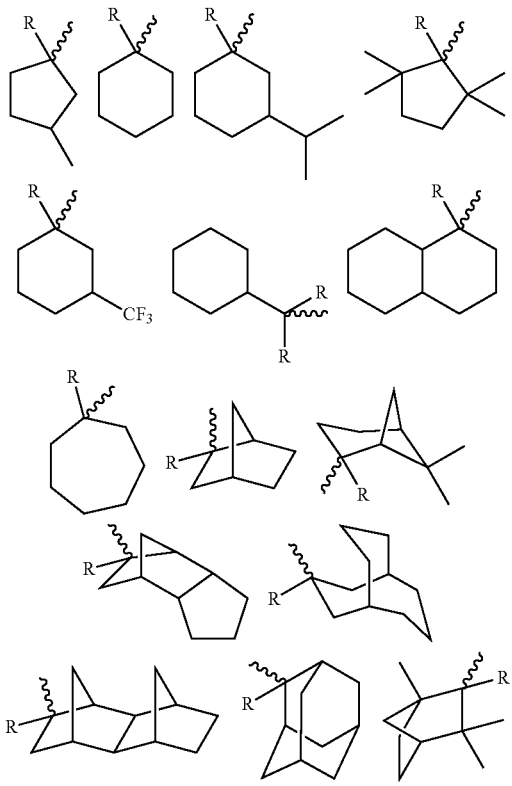

Suitable photoacid-labile acetal groups may be provided by reaction of a vinyl ether such as ethyl vinyl ether with a hydroxy or carboxy group.

In this regard, photoacid-labile groups also may be grafted onto other monomers, or a preformed polymer. For example, photoacid-labile esters and acetal moieties may be suitably grafted onto phenolic —OH groups of a formed resin or a phenolic monomer. For instance, an ester grafted onto a hydroxy group is a preferred acid-labile group (de-esterification occurs in the presence of photogenerated acid to provide developer-solublizing carboxy group). Such esters may be provided e.g. by reaction of a haloacetate compound (e.g. tert-butyl chloroacetate) with a phenolic hydroxy group. Acetal groups also are preferred photoacid-labile groups; for example a vinyl ether compound may be grafted onto a phenolic hydroxy moiety to provide a photoacid-labile acetal group. Suitable vinyl ether reagents to provide a photoacid-labile acetal group include compounds having at least one —(CH=CH)—O— group such as ethylvinyl ether and the like.

Polymers of the invention also may comprise other groups in addition or alternative to photoacid-labile groups. For example, dissolution enhancers may be included in a polymer of the invention, such as anhydrides and lactones. Suitable anhydrides include e.g. polymerized units that comprise maleic anhydride and/or itaconic anhydride. Suitable lactone groups include e.g. butyrolactone moieties. Contrast enhancing groups also may be present in polymers of the invention, such as groups provided by polymermization of methacrylic acid, acrylic acid, and such groups protected with photoacid labile groups e.g. ethoxyethyl methacrylate, t-butoxy methacrylate, and t-butylmethacrylate. As discussed above, groups that are essentially inert to photolithography also may be employed, such as carbocyclic aryl groups, particularly phenyl groups, which may be provided by reaction of styrene, and phenyl or other aryl groups that are optionally substituted by moieties that are essentially unreactive to thermal (e.g. between 150 to 200° C.) and photoacid conditions of photolithography.

In certain aspects of the invention, polymers that comprises polymerized acrylate groups are provided. References herein to an acrylate compound or polymer includes substituted acrylates such as a methacrylate. Phenolic/acrylate copolymers and higher order polymers such as terpolymers and tetrapolymers are particularly preferred. One or more polymer repeat units may comprise polymerized acrylate groups, including the spaced phenolic unit and/or unit(s) that comprise photoacid-labile moieties.

Suitably polymers of the invention contains from 30 to 90 mole percent phenolic units, more preferably 40 to 60 mole percent phenolic units. Polymers that contain non-phenolic (no hydroxy or carboxy substitution) phenyl units suitably have such units present in an amount of from 3 to 30 or 40 mole percent based on total polymer units, preferably from 5 to 10, 15 or 20 mole percent based on total polymer units.

As discussed, various moieties described herein, including moieties of polymers of the above formulae may be optionally substituted. A "substituted" group may be substituted at one or more available positions, typically 1, 2, or 3 positions by one or more suitable groups such as e.g. halogen (particularly F, Cl or Br); cyano; nitro; $C_{1-6}$alkyl sulfonyl such as mesyl; $C_{1-8}$ alkyl; $C_{1-8}$ alkoxy; $C_{2-8}$ alkenyl; $C_{2-8}$ alkynyl; hydroxyl; alkanoyl such as a alkanoyl e.g. acyl.

Polymer Syntheses

Polymers of the invention can be prepared by a variety of methods.

A variety of monomers having a spaced phenolic moiety are commercially available. Suitable monomers also may be readily synthesized. For example, a hydroquinone compound and an acrylic acid anhydride may be reacted under acidic conditions to provide a spaced phenolic acrylate compound. See, for instance, the procedures of Example 1 which follows, which yields hydroxyphenylmethacrylate.

More particularly, suitable monomers can be produced as shown in the following Scheme 1:

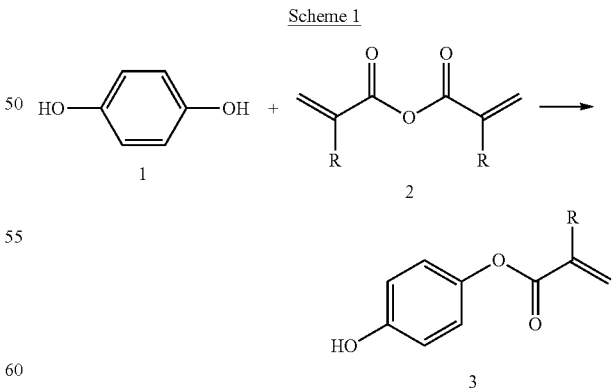

As outlined in the exemplary Scheme 1, reaction of a polyhydroxy phenyl compound such as hydroquinone 1 shown in Scheme 1 with a vinyl acid anhydride 2 in the presence of acid can provides a phenolic methacrylate compound 3. In Scheme 1 above, the depicted "R" is the same as defined in Formula (I) above. A particularly preferred synthesis of Scheme 1 is exemplified in Example 1 below.

Scheme 2

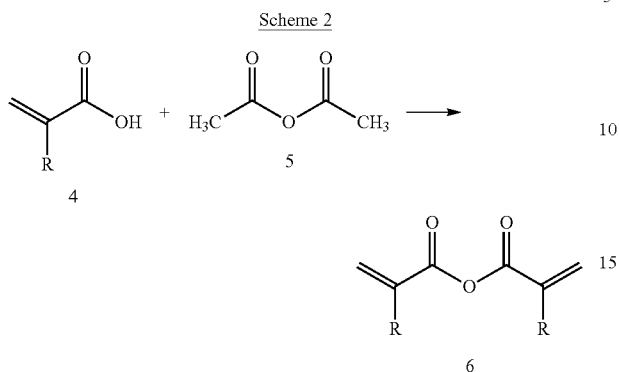

As outlined in the exemplary Scheme 2, a vinyl acid anhydride can be employed as reagent 2 in Scheme 1 above. More particularly, an acrylate acid 4 can be reacted with an acid anhydride 5, preferably in the presence of a further acid to provide a vinyl acid anhydride 6 to yield a phenolic methacrylate compound 3. In Scheme 2 above, the depicted "R" is the same as defined in Formula (I) above. A particularly preferred synthesis of Scheme 2 is exemplified in Example 2 below.

Scheme 3

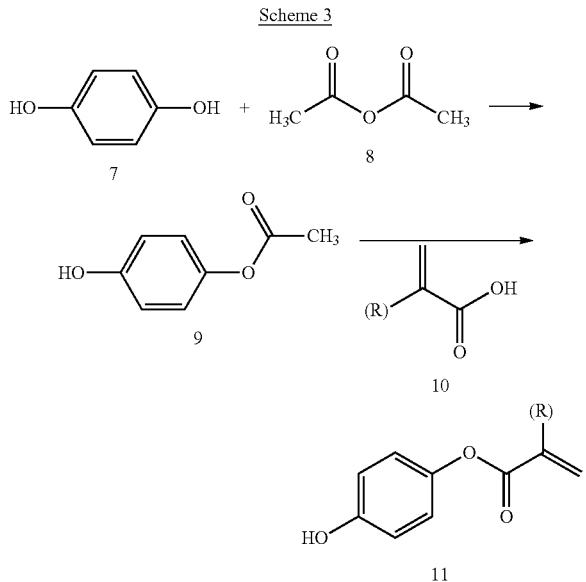

As outlined in the above exemplary Scheme 3, polyhydroxy compound 7 can be reacted with an acid anhydride 8 preferably in the presence of acid to provide mono-ester phenolic intermediate 9. If desired, excess starting materials may be recovered, and compound 9 is then reacted with acrylate acid 10 preferably in the presence of a further acid to provide phenolic methacrylate compound 11. In Scheme 3 above, the depicted "R" is the same as defined in Formula (I) above. A particularly preferred synthesis of Scheme 3 is exemplified in Example 3 below.

The two-step process outlined in Scheme 3 can provide several notable advantages including use of comparatively inexpensive reagents (e.g., $Ac_2O$). Additionally, the process of Scheme 3 can facilitate synthesis of the acrylate compound 11, i.e. where R of compound 11 is hydrogen.

Particularly preferred monomers that may be employed to form a polymer of the invention include those of the following Formula V:

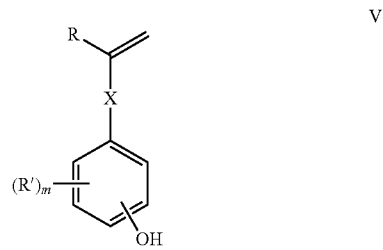

wherein R, $R^1$ and m are as defined in Formula I through IV above.

Acrylates are especially preferred monomers to employ to produce a polymer of the invention, such as compounds of the following Formula VI:

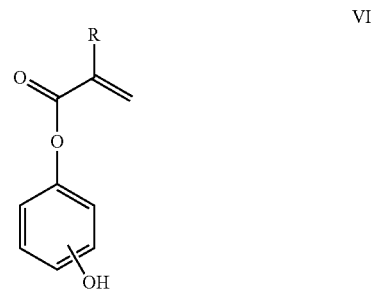

wherein R is hydrogen or optionally substituted alkyl such as optionally substituted $C_{1-6}$alkyl, and R is preferably hydrogen or methyl Polymers of the invention may be suitably formed by an addition reaction which may include free radical polymerization, e.g., by reaction of selected monomers (one of which includes a spaced phenolic group) to provide the various units as discussed above in the presence of a radical initiator under an inert atmosphere (e.g., $N_2$ or argon) and at elevated temperatures such as 70° C. or greater, although reaction temperatures may vary depending on the reactivity of the particular reagents employed and the boiling point of the reaction solvent (if a solvent is employed). Suitable reaction solvents include e.g. tetrahydrofuran and ethyl lactate. Suitable reaction temperatures for any particular system can be readily determined empirically by those skilled in the art based an the present disclosure. A variety of free radical initiators may be employed. For example, azo compounds may be employed such as azo-bis-2,4-dimethylpentanenitrile. Peroxides, peresters, peracids and persulfates also could be employed. See Examples 4 and 7 which follow for exemplary reagents and reaction conditions.

Suitable monomers for reaction to provide polymers of the invention include optionally substituted vinyl phenyl, optionally substituted styrene, optionally substituted alpha-methyl styrene, methacrylonitrile, acrylonitrile, 2-methyladamantylmethacrylate, 2-methyladamantylacrylate, or an alpha-butyrolactone methacrylate.

Other monomers that can be reacted to provide a polymer of the invention can be identified by those skilled in the art. For example, to provide acid labile groups, corresponding monomers can be reacted such as t-butymethacrylate, t-butylacrylate, t-butoxy methacrylate, t-butylmethacrylate; and ethoxyethyl methacrylate; to provide pendant acid groups corresponding monomers acid monomers can be reacted such as methacrylic acid and acrylic acid; and dissolution enhancers such as anhydrides which may be provided by reaction of suitable monomers such as itaconic anhydride and maleic anhydride.

Polymers of the invention suitably may have a wide ranges of molecular weights and molecular weight distributions. For instance, a polymer of the invention suitably may have a weight average molecular weight ($M_w$) of 1,000 to 100,000, more preferably 2,000 to 30,000, still more preferably from 2,000 to 15,000 or 20,000, with a molecular weight distribution ($M_w/M_n$) of 3 or less, more preferably a molecular weight distribution of 2 or less. Molecular weights (either $M_w$ or $M_n$) of the polymers of the invention are suitably determined by gel permeation chromatography.

Photoresist Compositions

As discussed above, further provided are photoresist compositions that comprise a resin component that contains a resin with spaced phenolic groups.

The photoresist compositions of the invention can provide highly resolved relief images upon exposure to short wavelengths, particularly 248 nm. Photoresists of the invention preferably are chemically-amplified positive resists, which utilize photoacid-induced cleavage of pendant alkyl ester or acetal polymer groups to provide solubility differentials between exposed and unexposed areas of a resist coating layer.

Polymers of the invention used in photoresist formulations should contain a sufficient amount of photogenerated acid labile ester groups to enable formation of resist relief images as desired. For instance, a suitable amount of such acid labile ester groups will be at least 1 mole percent of total units of the polymer, more preferably 2 to 50 or 60 mole percent. See the examples which follow for exemplary preferred polymers.

As discussed above, resists of the invention may contain one or more polymers in addition to and distinct from a polymer having spaced phenolic groups. Such additional polymers include those that have photoacid labile groups that may be deblocked under relatively mild conditions, e.g. a polymer than has acetal groups. Such a further polymer that has acetal groups suitably may be e.g. a phenolic polymer (e.g. a poly(vinylphenol)) that has acetal groups grafted onto the phenolic —OH moieties such as by reaction of the phenolic polymer with ether vinyl ether or other vinyl ether.

The amounts of each member of such a resin blend may vary rather widely, e.g. the weight ratio of a polymer having spaced phenolic groups relative to a second distinct resin may be 1:10 to 10:1, more preferably a weight ratio of from 2:8 to 8:2.

Photoresists of the invention comprise a photoactive components, preferably one or more photoacid generators (i.e. "PAG") that are suitably employed in an amount sufficient to generate a latent image in a coating layer of the resist upon exposure to activating radiation. Suitable photoacid generators include imidosulfonates such as compounds of the following formula:

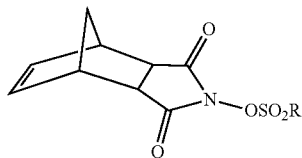

wherein R is camphor, adamantane, alkyl (e.g. $C_{1-12}$ alkyl) and perfluoroalkyl such as perfluoro($C_{1-12}$alkyl), particularly perfluorooctanesulfonate and perfluorononanesulfonate. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

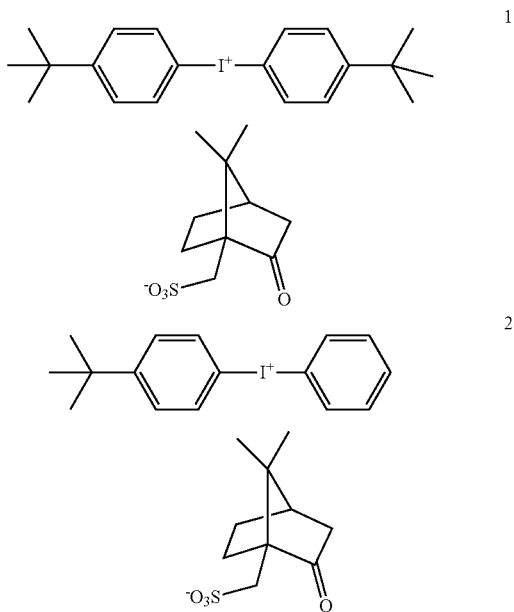

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate and perfluorobutanesulfonate.

Other known PAGS also may be employed in the resists of the invention.

A preferred optional additive of resists of the invention is an added base, particularly tetrabutylammonium hydroxide (TBAH), or tetrabutylammonium lactate, which can enhance resolution of a developed resist relief image. The added base is suitably used in relatively small amounts, e.g. 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper and glass substrates are also suitably employed.

The resists and methods of the invention are particularly use in e.g. the manufacture of thin film heads (e.g. 3 to 5 μm), magnetic disks, CD masks, and back-end implants.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from 1 to 100 mJ/cm$^2$, dependent upon the exposure tool and the components of the photoresist composition.

As discussed above, coating layers of the resist compositions of the invention are preferably photoactivated by a short exposure wavelength, particularly sub-300 nm exposure wavelengths such as 248 nm. However, the resist compositions of the invention also may be suitably imaged at higher wavelengths. For example, a resin of the invention can be formulated with an appropriate PAG and used as a chemically-amplified positive I-line resist, i.e. a resist imaged at 365 nm. Resists of the invention also will be useful for exposure with electron beams (E-beam exposure) and extreme-UV exposure (EUV) such as sub-50 nm or sub-20 nm exposure, particularly 13 nm exposure.

Following exposure, the film layer of the composition is preferably baked at temperatures ranging from 70° C. to 160° C. Thereafter, the film is developed. The exposed resist film is rendered positive working by employing a polar developer, preferably an aqueous based developer such as quatemary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or Methanol amine; cyclic amines such as pyrrole, pyridine, etc. In general, development is in accordance with procedures recognized in the art.

After development and any post-development thermal cure, an ion implant process may be conducted, e.g. by bombardment of the substrate with resist relief image with one or more dopant ions such as argon, boron, boron fluoride, arsenic, phosphorus and/or nitrogen, with arsenic, phosphorus and/or boron being more typically employed. The ion implanting is preferably conducted under high energy conditions, e.g. 20 eV or more, such as 40, 50, or 80 eV or more, and preferably under reduced pressure in a chamber.

Thereafter, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

As discussed above, photoresists of the invention are particularly useful to form metal bumps on a semiconductor wafer. Such processing can include: a) disposing on a semiconductor wafer a photoresist of the invention, preferably to provide a thick film coating layer such as a dried resist coating layer of 50 μm or greater; c) imagewise exposing the layer of photosensitive composition to actinic radiation, including sub-300 nm radiation particularly 248 nm; d) developing the exposed layer of photosensitive composition to provide patterned areas; e) depositing a metal into the patterned areas; and f) removing the exposed photosensitive composition to provide a semiconductor wafer having metal bumps.

In such bump-forming methods, the photoresist layer is imaged so as to form apertures such as vias in the photosensitive layer. In such process, the photosensitive layer is disposed on a conductive layer on the electronic device. Exposure of the photosensitive composition and subsequent development provides defined holes (vias) in the photosensitive composition and exposes the underlying conductive layer. Accordingly, the next step of the process is to deposit metal or metal alloy bumps with the defined holes (vias). Such metal deposition may be by electroless or electrolytic deposition processes. Electrolytic metal deposition is preferred. In an electrolytic metal deposition process, the electronic device substrate, i.e. semiconductor wafer, functions as the cathode.

Prior to deposition of a metal or metal alloy, such as that suitable as a solder, a conductive layer such as copper or nickel may be deposited by sputtering, electroless deposition and the like, to form the under-bump-metal. Such under-bump-metal layer is typically from 1000 to 50,000 Å in thickness and acts as a wettable foundation to the subsequently plated solder bump.

A wide variety of metals may be deposited electrolessly, including, but not limited to, copper, tin-lead, nickel, gold, silver, palladium, and the like. Suitable metals and metal alloys that may be deposited electrolytically include, but are not limited to, copper, tin, tin-lead, nickel, gold, silver, tin-antimony, tin-copper, tin-bismuth, tin-indium, tin-silver, palladium, and the like. Such metal plating baths are well known to those skilled in the art and are readily available from a variety of sources.

In one embodiment, the metal deposits on the semiconductor wafer are useful as solder bumps. Accordingly, it is preferred that the metal bumps are solderable metals and metal alloys, such as tin, tin-lead, tin-copper, tin-silver, tin-bismuth, tin-copper-bismuth, tin-copper-silver, and the like. Suitable metals and metal alloys for solder bump formation are disclosed in U.S. Pat. No. 5,186,383; 5,902,472; 5,990,564; 6,099,713; and 6,013,572, as well as European Patent Application No. EP 1 148 548 (Cheung et al.). Exemplary metals and metal alloys include, but are not limited to: tin; tin-copper alloy having less than 2% wt copper and preferably about 0.7% wt copper; a tin-silver alloy having less than 20% wt silver and preferably from 3.5 to 10% wt silver; a tin bismuth alloy having from 5 to 25% wt. bismuth and preferably about 20% wt bismuth; and a tin-silver-copper alloy having less than 5% wt silver and preferably about 3.5% wt silver, less than 2% wt copper and preferably about 0.7% wt copper, and the balance being tin. In one embodiment, the metal alloys used for solder bumps are lead-free, i.e. they contain ≤10 ppm of lead.

In general, suitable electrolytic metal plating baths are acidic and contain acid, water a soluble form of the metal or metals to be deposited and optionally one or more organic additives, such as brighteners (accelerators), carriers (suppressors), levelers, ductility enhancers, wetting agents, bath stabilizers (particularly for tin-containing baths), grain refiners and the like. The presence, type and amount of each optional component varies depending upon the particular metal plating bath used. Such metal plating baths are generally commercially available.

Binary alloys may be deposited from a single bath, as in the case of tin-copper, tin-bismuth, tin-silver, tin-lead and the like, or may be deposited as individual layers from multiple plating baths and reflowed to form and alloy. Such reflow technique is described in U.S. Pat. No. 6,013,572. Such reflow is typically performed after removal of the remaining photosensitive composition.

In such a process, the resist composition functions as a protective layer to areas that are not to be plated. Following metal deposition, the remaining resist composition is stripped, such as by using a commercially available N-methylpyrrolidone ("NMP") based stripper at a temperature of about 40° to 69° C.

The following non-limiting examples are illustrative of the invention.

EXAMPLE 1

Preparation of Methacrylic Acid Anhydride/methacrylic Acid Mixture

Acetic anhydride was added by dropwise addition to an excess of methacrylic acid (4:1) while simultaneously distilling acetic anhydride from the mixture. The reaction was carried out at 95 Oc and 300 mmHg, catalyzed by 1 mole % amberlyst-15 (A-15), and inhibited with 3000 ppm PTZ and 1000 MEHQ pppm, 8% $O_2$. At the end of the reaction, excess methacrylic acid was recovered by distillation under reduced pressure and the catalyst was recovered by filtration.

EXAMPLE 2

Monomer Synthesis; Preparation of Hydroxyphenyl Methacrylate

To a mechanically stirred solution of 2 moles of hydroxyquinone dissolved in 3 moles of methacrylic acid at 120° C. and atmospheric pressure was added dropwise (30 min) 1 mole of methylacrylic acid anhydride and the mixture was maintained at 120° C. with stirring for additional 4 hrs (NMR analysis). Throughout the course of the reaction 8% oxygen was admitted to the system. At the end of the reaction, the methacrylic acid was recovered by distillation under reduced pressure (110° C. and 200 mmHHg), and the unreacted excess hydroquinone was precipitated out by the addition of toluene (1 liter) to the reaction mixture. A low level (1-2%) of the monomer 2-methyl-5-methylenehexanedioic acid was formede. This monomer was separated from the mixture by a washing step with distilled water. After phase separation, the desired 4-hydroxyphenyl methacrylate was obtained at 97% yield by the distillation of toluene under reduced pressure. {mp. (Uncorrected) 120° C.; Anal. Calcd. For $C_{10}H_{10}O_3$: C, 67.41: H, 5.66; O, 26.94. Found: C, 67.37; H, 5.62}.

EXAMPLE 3

Monomer Synthesis; Preparation of Hydroxyphenyl Methacrylate through Mono-Ester Intermediate A large excess of hydroquinone is reacted with acetic acid anhydride in the presence of acetic acid to provide the mono-acetate phenolic compound $1,4-C_6H_4(OH)(OOCCH_3)$. Excess starting materials are recovered, and the intermediate compound $1,4-C_6H_4(OH)(OOCCH_3)$ is reacted with methacylic acid in the presence of acetic acid to provide hydroxyphenyl methacrylate.

EXAMPLE 4

Polymer Synthesis

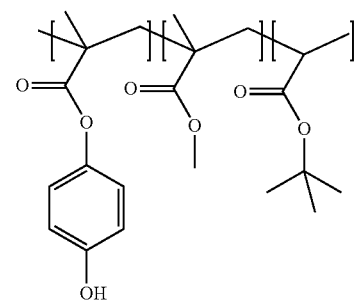

HPhMA:MMA:TBA Structure

To a 500 mL, 3 neck round bottom flask equipped with a condenser, thermometer, magnetic stirrer and external oil heating bath, was added the following: 4-hydroxyphenyl methacrylate (HPhMA) (16.56 g, 0.093 mol), methyl methacrylate (MMA) (15.54 g, 0.155 mol), and tert-butyl acrylate (TBA) (7.95 g, 0.062 mol). Methanol (270 mL) was added and the resulting solution heated to reflux (67° C.). Once at reflux, a solution of initiator 2,2'-azobis-2,4-dimethylpentanenitrile (1.54 g, 0.006 mol) in methanol (17.5 mL). The solution was held for 2 hours at reflux, after which another charge of initiator was added to the flask (0.77 g, 0.003 mol) in methanol (9 mL). The solution was held at reflux for 16 hours. After cooling, the polymer solution in methanol was washed with heptanes (3×300 mL). The solution was concentrated on a rotary evaporator to remove residual heptanes and then precipitated into DI water (2 liters). The wet cake was air dried for 24 hours and then dried at 60° C. under vacuum for 18 hours. The yield was 90%.

EXAMPLE 5-6

Additional Polymer Synthesis

Additional HPhMA:MMA:TBA terpolymers were prepared by the procedures of Example 4 above, but varying amount of monomers employed. In Table 1 below which follows Example 9, the ratio of each of the monomer units (as determined by $^{13}C$ NMR analysis of the formed polymer), weight average molecular weight (Mw) and polydispersity (PD) are provided for the HPhMA:MMA:TBA terpolymers formed in Examples 5 and 6.

EXAMPLES 7

Additional Polymer Synthesis

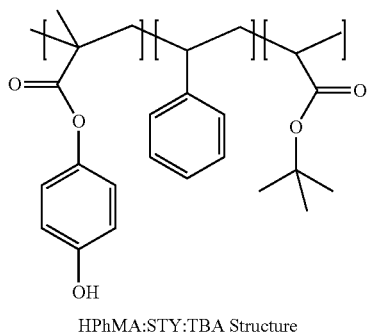

HPhMA:STY:TBA Structure

To a 500 mL, 3 neck round bottom flask equipped with a condenser, thermometer, magnetic stirrer and external oil heating bath, was added the following: 4-hydroxyphenyl methacrylate (HPhMA) (27.94 g, 0.157 mol), styrene (STY) (10.89 g, 0.105 mol), and tert-butyl acrylate (TBA) (11.17 g, 0.087 mol). Methanol (340 mL) was added and the resulting solution heated to reflux (67° C.). Once at reflux, a solution of initiator 2,2'-azobis-2,4-dimethylpentanenitrile (1.73 g, 0.007 mol) in methanol (20 mL). The solution was held for 2 hours at reflux, after which another charge of initiator was added to the flask (0.87 g, 0.004 mol) in methanol (10 mL). The solution was held at reflux for 16 hours. After cooling, the polymer solution in methanol was washed with heptanes (3×300 mL). The solution was concentrated on a rotary evaporator to remove residual heptanes an then precipitated into DI water (2.5 liters). The wet cake was air dried for 24 hours and then dried at 60° C. under vacuum for 18 hours. The yield was 90%.

EXAMPLE 8-9

Additional Polymer Synthesis

Additional HPhMA:STY:TBA terpolymers were prepared by the procedures of Example 7 above, but varying amount of monomers employed. In Table 1 below, the ratio of each of the monomer units (as determined by $^{13}C$ NMR analysis of the formed polymer), weight average molecular weight (Mw) and polydispersity (PD) are provided for the HPhMA:STY:TBA terpolymers formed in Examples 8 and 9.

TABLE 1

Polymer Characterization

| Example | Polymer Description | Composition (13C-NMR) | Mw | PD |
|---|---|---|---|---|
| 4 | HPhMA/MMA/TBA | 32/51/17 | 15400 | 2.7 |
| 5 | HPhMA/MMA/TBA | 42/40/18 | 18300 | 2.9 |
| 6 | HPhMA/MMA/TBA | 55/27/18 | 20200 | 3.1 |
| 7 | HPhMA/STY/TBA | 44/26/30 | 15300 | 2.6 |
| 8 | HPhMA/STY/TBA | 50/34/16 | 13100 | 2.3 |
| 9 | HPhMA/STY/TBA | 54/33/13 | 13700 | 2.3 |

EXAMPLE 10

Dissolution Rate Studies

Polymers of the above examples were coated to approximately equal dried (soft bake) coating layers over a wafer substrate. Dissolution rates were measured of those polymer coating layers with a 0.26 N alkaline aqueous developer. Dissolution rates are set forth in Table 2 below. Measured Tg values also are set forth in Table 2 below.

TABLE 2

Polymer Characterization

| Example | Polymer Description | Tg (° C.) | OD at 248 nm (1/μ) | DR (A/sec) in 0.26N TMAH |
|---|---|---|---|---|
| 4 | HPhMA/MMA/TBA | 116 | 0.53 | 1.2 |
| 5 | HPhMA/MMA/TBA | 125 | 0.67 | 16.6 |
| 6 | HPhMA/MMA/TBA | 130 | 0.78 | 115 |
| 7 | HPhMA/STY/TBA | 106 | 0.63 | 0.36 |
| 8 | HPhMA/STY/TBA | 117 | 0.73 | 2.0 |
| 9 | HPhMA/STY/TBA | 122 | 0.79 | 7.8 |

EXAMPLE 11

Optical Density Evaluations

Polymers of the above examples were coated to approximately equal dried (soft bake) one micron thick coating layers over a wafer substrate. Polymer layer thickness was measured by ellipsometry. The absorbance of the films on quartz was determined by UV spectrophotometry. The absorbance was measured against a blank quartz wafer. Optical density (OD) was calculated at 248 nm using thickness and absorbance measurements. Measured OD values are set forth in Table 3 below.

TABLE 3

Polymer Characterization

| Example | Polymer Description | OD at 248 nm (1/μ) |
|---|---|---|
| 4 | HPhMA/MMA/TBA | 0.53 |
| 5 | HPhMA/MMA/TBA | 0.67 |
| 6 | HPhMA/MMA/TBA | 0.78 |

TABLE 3-continued

Polymer Characterization

| Example | Polymer Description | OD at 248 nm (1/μ) |
|---|---|---|
| 7 | HPhMA/STY/TBA | 0.63 |
| 8 | HPhMA/STY/TBA | 0.73 |
| 9 | HPhMA/STY/TBA | 0.79 |

EXAMPLE 12

Photoresist Preparation and Lithographic Processing

A photoresist of the invention is prepared by admixing the following components in the specified amounts:

| Resist component | Amount |
|---|---|
| Resin | to provide 11.4 wt. % total solids liquid formulation |
| Photoacid generator | 3.5 wt. % of resin component |
| Basic additive | 0.1 wt. % of polymer |
| Surfactant | 0.05 wt. % of total solids. |

In that resist, the polymer is a HPhMA:MMA:TBA terpolymer prepared as described in Example 4. The photoacid generator of the resist is di-tertbutylphenyliodonium camphorsulfonate. The basic additive is the lactate salt of tetremethylammoniium hydroxide. The surfactant is the commercially available material sold under the name R08. The solvent is ethyl lactate.

That photoresist composition is spin coated onto 200 min silicon wafers having a coating of an organic antireflective composition. The applied photoresist later is soft-baked at 90° C. for 60 seconds and exposed through a photomask to 248 nm radiation. The exposed resist coating layer is then baked at 100° C. for 90 seconds and developed using an alkaline aqueous developer.

EXAMPLE 13

Additional Photoresist Preparation and Lithographic Processing

A photoresist of the invention is prepared by admixing the following components in the specified amounts:

| Resist component | Amount |
|---|---|
| Resin | to provide 11.4 wt. % total solids liquid formulation |
| Photoacid generator | 3.53 wt. % of resin component |
| Basic additive | 0.12 wt. % of polymer |
| Surfactant | 0.05 wt. % of total solids. |

In that resist, the polymer was a HPhMA:STY:TBA terpolymer prepared as described in Example 7. The photoacid generator of the resist is di-tertbutylphenyliodonium camphorsulfonate. The basic additive is the lactate salt of tetremethylammoniium hydroxide. The surfactant is the commercially available material sold under the name R08. The solvent is ethyl lactate.

That photoresist composition is spin coated onto 200 mm silicon wafers having a coating of an organic antireflective composition. The applied photoresist later is soft-baked at 90° C. for 60 seconds and exposed through a photomask to 248 nm radiation. The exposed resist coating layer is then baked at 100° C. for 90 seconds and developed using an alkaline aqueous developer.

What is claimed is:

1. A photoresist composition comprising a photoactive component and a resin, the resin comprises a structure of the following formula:

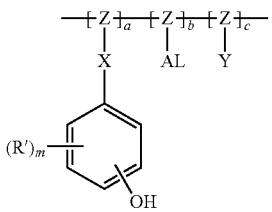

wherein each Z is the same or different bridge unit;
X comprises one or more alkyl, oxygen or sulfur atoms;
each $R^1$ is the same or different non-hydrogen substituent; and m is an integer of from zero to 4;
AL is a moiety that comprises a photoacid-labile group;
Y is a moiety that is distinct from the spaced phenolic group or moiety that comprises AL, and Y is selected from the group consisting of phenyl; phenyl substituted with halogen, cyano, alkyl or alkoxy; an ester that does not undergo a photoacid-induced cleavage reaction during exposing and developing of the photoresist layer; an alicyclic group; and a lactone; and
a, b and c are mole percents of the respective polymer units based on total repeat units in the polymer and a, b and c are each greater than zero.

2. A photoresist composition of claim 1 wherein X consists essentially of one or more alkyl or oxygen atoms.

3. A photoresist composition of claim 1 wherein Y is selected from the group consisting of phenyl; phenyl substituted with halogen, cyano, alkyl or alkoxy; an ester that does not undergo a photoacid-induced cleavage reaction during exposing and developing of the photoresist layer.

4. A photoresist composition of claim 1 wherein the resin comprises a structure of the following formula

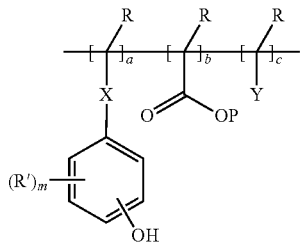

each R is the same or different and is hydrogen or optionally substituted alkyl;
each Z is the same or different bridge unit;
X comprises one or more alkyl, oxygen or sulfur atoms;
each $R^1$ is the same or different non-hydrogen substituent;
m is an integer of from zero to 4;
P is a moiety that provides a photoacid-labile ester;
Y is a moiety that is distinct from the spaced phenolic group or moiety that comprises P, and Y is selected from the group consisting of phenyl; phenyl substituted with halogen, cyano, alkyl or alkoxy; an ester that does not undergo a photoacid-induced cleavage reaction during exposing and developing of the photoresist layer; an alicyclic group; and a lactone; and a, b and c are mole percents of the respective polymer units based on total repeat units in the polymer and are each greater than zero.

5. A photoresist composition of claim 4 wherein X consists essentially of one or more alkyl or oxygen atoms.

6. A photoresist composition of claim 4 wherein the resin comprises polymerized units of hydroxyphenylmethacrylate; methyl methacrylate; and tert-butyl acrylate.

7. A photoresist composition of claim 4 wherein the resin comprises polymerized units of hydroxyphenylmethacrylate; styrene; and tert-butyl acrylate.

8. A photoresist composition of claim 4 wherein Y is selected from the group consisting of phenyl; phenyl substituted with halogen, cyano, alkyl or alkoxy; an ester that does not undergo a photoacid-induced cleavage reaction during exposing and developing of the photoresist layer.

* * * * *